US012692848B2

(12) United States Patent　(10) Patent No.:　US 12,692,848 B2
Sánchez Somolinos et al.　(45) Date of Patent:　Jul. 28, 2026

(54) MICROFLUIDIC VALVE, METHOD FOR ITS MANUFACTURE, AND USES THEREOF

(71) Applicants:CONSEJO SUPERIOR DE INVESTIGACIONES CIENTÍFICAS (CSIC), Madrid (ES); UNIVERSIDAD DE ZARAGOZA, Saragossa (ES)

(72) Inventors: Carlos Sánchez Somolinos, Saragossa (ES); Ignacio Ochoa Garrido, Saragossa (ES); Luis Javier Fernández Ledesma, Saragossa (ES); Manuel Doblaré Castellano, Saragossa (ES)

(73) Assignees: CONSEJO SUPERIOR DE INVESTIGACIONES CIENTÍFICAS (CSIC), Madrid (ES); UNIVERSIDAD DE ZARAGOZA, Saragossa (ES)

( * ) Notice: Subject to any disclaimer, the term of this patent is extended or adjusted under 35 U.S.C. 154(b) by 742 days.

(21) Appl. No.: 18/012,467

(22) PCT Filed: Jun. 22, 2021

(86) PCT No.: PCT/ES2021/070464
§ 371 (c)(1),
(2) Date: Dec. 22, 2022

(87) PCT Pub. No.: WO2021/260249
PCT Pub. Date: Dec. 30, 2021

(65) Prior Publication Data
US 2023/0258164 A1　Aug. 17, 2023

(30) Foreign Application Priority Data
Jun. 23, 2020　(ES) ............................... ES202030624

(51) Int. Cl.
*F04B 19/00*　(2006.01)
*B81B 3/00*　(2006.01)
(Continued)

(52) U.S. Cl.
CPC .......... *F04B 19/006* (2013.01); *B81B 3/0018* (2013.01); *F04B 17/00* (2013.01);
(Continued)

(58) Field of Classification Search
None
See application file for complete search history.

(56) References Cited

U.S. PATENT DOCUMENTS 9,651,166 B2 * 5/2017 Mescher ............... A61M 39/22
2005/0274423 A1 * 12/2005 Oka .................... F16K 99/0001
137/828
(Continued)

FOREIGN PATENT DOCUMENTS

CN 　101709789 A 　5/2010
KR 20120060647 A 　6/2012
(Continued)

OTHER PUBLICATIONS

Maria Lopez-Valdeolivas, "4D Printed Actuators with Soft-Robotic Functions", Journal, 2018, 1-7, vol. 39, Macromolecular Rapid Communications.
J. Schiphorst, "Light responsive polymers : from molecule to device", Journal, 2018, 1-111, Eindhoven University of Technology.

*Primary Examiner* — Lore R Jarrett
(74) *Attorney, Agent, or Firm* — Hayes Soloway PC

(57) ABSTRACT

A microfluidic valve, includes arranging a substrate of a mechanically inert material to one or more physicochemical properties over time, configuring a structural portion of the valve; using additive layer manufacturing to print, a succession of one or more filaments of a material with mechanical response to one or more of said physicochemical properties over time, preferably LCP, configuring a functional portion of the valve; and arranging the succession of filaments on the substrate, configuring a fluid flow rate through the valve
(Continued)

using the application of an anti-adhesion treatment on one or more interfaces of said filaments and the substrate.

25 Claims, 3 Drawing Sheets

(51) Int. Cl.
| | | |
|---|---|---|
| *F04B 17/00* | (2006.01) | |
| *F04B 43/12* | (2006.01) | |
| *F16K 99/00* | (2006.01) | |

(52) U.S. Cl.
CPC .......... *F04B 43/12* (2013.01); *F16K 99/0001* (2013.01); *F16K 2099/0073* (2013.01); *F16K 2099/0084* (2013.01); *F16K 2099/0094* (2013.01)

(56) References Cited

U.S. PATENT DOCUMENTS

| | | | |
|---|---|---|---|
| 2008/0041453 A1* | 2/2008 | Wimberger-Friedl | ....................... G01N 21/645 137/13 |
| 2013/0206250 A1* | 8/2013 | Zhang | ................. F16K 99/0044 137/237 |
| 2020/0038864 A1* | 2/2020 | Ball | .................... B01L 3/50273 |

FOREIGN PATENT DOCUMENTS

| | | |
|---|---|---|
| KR | 20130054867 A | 5/2013 |
| WO | 0102737 A1 | 1/2001 |
| WO | 2006020093 A2 | 2/2006 |
| WO | 2006038159 A1 | 4/2006 |
| WO | 2013124449 A1 | 8/2013 |

* cited by examiner (a)          (b)          (c)

MICROFLUIDIC VALVE, METHOD FOR ITS MANUFACTURE, AND USES THEREOF

CROSS-REFERENCE TO RELATED APPLICATIONS AND PRIORITY

This patent application claims priority from PCT Application No. PCT/ES2021/070464 filed Jun. 22, 2021, which claims priority from Spanish Patent Application No. P202030624 filed Jun. 23, 2020. Each of these patent applications are herein incorporated by reference in their entirety.

The project that gave rise to this application received funding from the European Union's Horizon 2020 research and innovation program under grant agreement no. 829010.

FIELD OF THE INVENTION

The present invention belongs to the field of microfluidics. More specifically, the invention relates to a new technology of microfluidic actuators, which are preferably valves, having a mechanical and functional response when subjected to external stimuli, such as changes in light intensity, temperature, pH, humidity, or electromagnetic field, among others.

BACKGROUND OF THE INVENTION

Microfluidic devices, also referred to as microfluidic chips, enable the precise handling of small amounts of fluid samples, facilitating reliable, fast, accurate and high-throughput analytical assays. Advances in microfluidics have had a major impact on the field of biomedicine, contributing to the development of new tools for drug screening, biological studies, and in situ diagnostics, and this field also holds great promise for advances in personalized medicine. Besides in the health field, microfluidics is also a crucial technology in other areas which require fast and cost-effective analytical tools, such as the monitoring and control of environmental pollution, biological risk detection, or the food industry, among others. As a result, the microfluidics market is expected to continue to grow at a compound annual growth rate (CAGR) of 19% over the next five years (estimated at EUR 9 billion in 2021).

Most of today's microfluidic devices need large and expensive auxiliary equipment arranged off-chip, for the purpose of controlling liquid flows inside said chip or for performing analytical tasks on said flows. This means that the cost of microfluidic platforms is high, typically exceeding €20,000, and, generally, the operations thereof can only be performed by highly skilled personnel (see, for example, J. ter Schiphorst et al., Lab Chip (2018) 18, 699). Although different existing solutions have attempted to integrate all these elements within the chip itself at the laboratory level, the intrinsic small size and complexity of these devices, as well as the difficulties to process different types of materials in them, make the integration of all the required functions in a single device only feasible at the laboratory scale. This precludes, for the time being, the development of stand-alone microfluidic devices with current technologies that are industrially viable and marketable.

Regarding the mechanical response of microfluidic devices developed to date, they have a limited capacity to perform certain operations, for example, for the opening or closing of channels by using valves or the generation of controlled liquid flow by using pumps. For this reason, most of these operations are performed outside the microfluidic chip itself, using external auxiliary elements. In previous technologies belonging to the state of the art, the integration of active pumps and valves into the microfluidic chip has been tested, using electro-osmotic or piezoelectric pumps, as well as stimuli-sensitive hydrogels that perform certain functions, similar to externally activated valves. However, the intrinsic small size and complexity of microfluidic devices, as well as the high diversity of material types used in this sector (where compatibility with known pumps and valves is not always possible) and the complexity of the processing technologies required to implement them in their final form, make the integration of all functional elements into a single monolithic and compact device difficult, inherently costly and, in short, unfeasible for large-scale industrial production. All these limitations prevent further market penetration of microfluidic technologies and limit the development of new innovative devices capable of taking microfluidic technology to a new stage.

The present invention is intended for solving the aforementioned problems, allowing the manufacture of novel microfluidic devices that can perform different mechanical functions characteristic of the chip as a response to the application of external stimuli, such as temperature, light, pH, or other physicochemical properties. In this way, said microfluidic devices can be controlled remotely and operate dynamically.

BRIEF DESCRIPTION OF THE INVENTION

To solve the aforementioned limitations and problems, the present invention proposes the use of the mechanical response capability of liquid crystal networks or elastomers (LCN or LCE) to certain external stimuli (light, temperature, etc.). The LCN and LCE can be obtained from a liquid crystal polymer (LCP) which is subjected to a polymer chain cross-linking process. This latter material can be applied in a controlled manner by additive layer manufacturing techniques and, once cross-linked, give rise to the LCN or LCE which allow the configuration of active microfluidic valves with mechanical response capability to changes in physicochemical magnitudes such as lighting, humidity, pH, temperature, or electromagnetic field, among others. Said mechanical response thereby allows regulation of the flow of a fluid in a microfluidic device, for example, in the form of a valve, regulating or driving said fluid in a larger circuit or system in a variable manner over time. In this context, additive printing processes of LCPs and the transformation thereof into LCEs or LCNs with the mentioned functional properties shall be referred to as, in the scope of interpretation of the invention, "4D printing" processes (given their response capability over time, which is considered the fourth dimension).

Although the use of 4D printing methods for LCEs and LCNs is already known on a general level (so, therefore, it is not an object of the invention), the specific application thereof to the manufacture of microfluidic valves has not previously been described according to the features herein claimed, wherein the LCPs are printed under specific, fixed geometric arrangements, giving rise to a cross-linked polymer system LCE or LCN, and allowing the configuration of the effective actuation of said valves in microfluidic devices. In that sense, as a result of the selected printing process, local anisotropy of the printed materials is achieved, so that the long polymer chains of the LCPs are oriented in the direction of movement of the needle defining the direction of the filament during its deposition on other materials used as a substrate, leading to a precise control of the morphology of the LCE or LCN resulting from the cross-linking of the LCP chains that allows to subsequently perform the required microfluidic flow regulation functions. Once configured in the form of a valves, the reduction in the molecular order of the cross-linked LCPs, caused by an external stimulus, such as temperature, light, etc., leads to the contraction of the material along the preferred orientation direction of the polymer chain mesogenic units in its main orientation, as well as to its expansion along its orthogonal orientations. As a result of this behavior, it is possible to regulate the functionality of the valve by means of a suitable selection of materials (according to whether the properties thereof are required to be regulated by means of physicochemical parameters and others) and of a printing arrangement which allows the desired behavior to be obtained in space and time. In general, the mechanical response properties of certain LCNs or LCEs with respect to external changes are known in the state of the art and, therefore, are not part of the object of the invention. Again, it is the configuration and specific embodiments thereof in the form of microfluidic valves that are herein claimed. Likewise, although the term LCP shall be used herein to refer to the inks used in the scope of the invention, the interpretation of said term shall include not only the polymer chains of liquid crystal, but also liquid crystal monomers, as well as the combinations thereof, and generally any material which acquires anisotropy upon being deposited due to the preferred orientation of its components.

Therefore, a main object of the invention relates to a method for the manufacture of a microfluidic valve which comprises performing the following steps:

arranging a substrate configuring a structural portion of the valve, wherein said substrate comprises at least one mechanically inert material to one or more physicochemical properties over time;

printing, by means of additive layer manufacturing, at least one mechanically responsive material to one or more of said physicochemical properties over time, wherein said properties can be acquired both prior to and during or after printing. Said material comprises at least one LCP and is printed as a succession of one or more filaments, configuring a functional portion of the valve.

Advantageously, said manufacturing method comprises an additional step of arranging the succession of filaments of the mechanically responsive material on the substrate of a mechanically inert material by applying an anti-adhesion treatment on one or more interfaces of said filaments and the substrate. In this way, the substrate and the succession of filaments at least partially configure a fluid flow rate through the valve, wherein the succession of filaments of the mechanically responsive material is arranged, in the mentioned flow rate, such that the variation in one or more of the physicochemical parameters causes a disruption in the molecular order of the LCP, contracting or expanding its polymer chains along a longitudinal or transversal direction of the filaments, and leading to an increase or reduction of the fluid flow rate. The interpretation of the above embodiment shall be understood to likewise comprise cases where the mechanically responsive material is printed directly on the substrate forming part of the structure of the valve, like those cases where the mechanically responsive material is temporarily printed on a first substrate (as a manufacturing support) and is subsequently transferred or connected to a second substrate which is what forms part of the structure of the valve.

As a result, the valves obtained with the technology of the invention allow the establishment of a precise programming of the magnitude and of the directionality of the forces applied to the flow rate configured by the substrate and mechanically responsive material, and it allows the regulation of the fluid flows circulating through a microfluidic system. It is thereby possible to control with precision the resulting structures both in space and in time in a reversible and well-defined manner. In that sense, with the precise design of the internal structure and of the generated forces (which can be obtained by means of the described 4D printing platforms), the invention allows obtaining complex geometries and functions that cannot be obtained with the currently available LCP processing technologies. Besides tension or flexion, the invention further allows other more complex functions to be generated, such as the opening of pores or even the rotation of the functional portions of the valves, thus granting new possibilities and functions of shape transformation to technologies of known liquid crystal (LC) actuators. The concept of LCP 4D printing can potentially be extend to both temperature and light, as well as to a wide range of external stimuli, such as electrical and magnetic fields, pH, or humidity, among others, if the proper materials are provided, prepared with suitable functional groups or molecular switches. Furthermore, these actuators can be manufactured directly on other substrates or devices, as well as on large surfaces, which takes the proposed technology one step closer to industrial production. In particular, as a preferred embodiment, the described printing method allows to integrate 3D printed mechanically responsive LCP elements with inert materials commonly used in microfluidics, such as polydimethylsiloxane (PDMS), allowing the preparation of adaptable composite devices, wherein the functional portion of the valve deforms and protrudes, acting for example as a lens. As described, PDMS is a key material in biological and medical microfluidic devices, so the 4D printing method for LCP materials of the invention represents a promising opportunity to generate dynamically adjustable systems, such as microfluidic pumps or valves, which can be integrated in microfluidic devices according to the specific embodiments described below.

In that sense, in a preferred embodiment of the method of the invention, the succession of filaments of the mechanically responsive material is arranged, in the mentioned fluid flow rate, as a plurality of substantially parallel filaments, forming a rectangular or square surface.

In another preferred embodiment of the method, the succession of filaments of the mechanically responsive material is arranged, in the mentioned fluid flow rate, adopting a substantially planar radial distribution, wherein each filament starts from a central region common to the rest of filaments.

In another preferred embodiment of the method, the succession of filaments of the mechanically responsive material is arranged, in the mentioned fluid flow rate, as an azimuthal distribution or, as an approximation to same, a substantially planar spiral starting from a central region common to one or more filaments, which can be more easily implemented in practice.

In another preferred embodiment of the method, said method comprises the additional step of modifying the surface to promote adhesion between the constituent elements. This modification may consist, for example, of exposing the corresponding surfaces to ozone generated by ultraviolet (UV) radiation, oxygen plasma, or other gases. Likewise, a coupling agent can be applied between at least one part of the mechanically responsive material and the substrate. More preferably, the coupling agent is a hybrid organic-inorganic coupling agent (for example, amino-, mercapto-, or epoxy-silanes).

In another preferred embodiment of the method, the anti-adhesion treatment comprises:

the addition of a chemical agent with anti-adhesion capability to LCP, preferably one or more fluorinated modifiers or long-chain aliphatic silanes, such as nonyl trichlorosilane, octadecyl trichlorosilane, octyl trichlorosilane, fluoro-n-octyl trichlorosilane, or fluoro-n-octyl trimethoxysilane; and/or the introduction of micro-roughness on the contact surface of the substrate of a mechanically inert material with the succession of filaments; and/or the use of materials with a surface energy less than 40 mJ/m$^2$ for the manufacture of the substrate and/or the succession of filaments; and/or the application of an anti-adhesion coating on the substrate of a mechanically inert material and/or on the succession of printed filaments; and/or the spatial separation of the succession of filaments with respect to the substrate.

In another preferred embodiment of the method, the method comprises the additional arrangement of one or more layers of a mechanically inert material after printing the mechanically responsive material, configuring one or more additional elements of the structural portion of the valve. Optionally, said method may comprise a step of applying an anti-adhesion treatment on one or more of the additional layers of a mechanically inert material to prevent the irreversible adhesion between the layers, with the substrate, and/or with the succession of filaments.

In another preferred embodiment of the method, the method comprises a step of applying a curing treatment after finishing the printing of the mechanically responsive material. More preferably, said curing step is performed selectively in certain regions of the valve, and/or is applied by means of a succession of multiple curing operations on said regions.

In another preferred embodiment of the method, the printing of the succession of filaments of the mechanically responsive material is made in a three-dimensional shape, and more preferably, in a conical shape following a radial distribution. In this way, when the succession of filaments is stimulated by means of an external agent (temperature, light, etc.), said succession of filaments modifies its shape towards a cone of smaller height and wider base, allowing the realization, for example, of reverse-acting or normally closed valves; that is, those which, in the absence of an external stimulus, prevent the flow of the fluid, which is otherwise allowed.

A second object of the invention relates to a valve for regulating the flow of a fluid through a microfluidic device which is advantageously manufactured following a method according to any of the embodiments herein described.

In a preferred embodiment of the valve of the invention, the mechanically responsive material comprises a mixture of at least one main-chain LCP with reactive acrylate groups at the end of said chain, together with one or more photoinitiators.

In another preferred embodiment of the valve of the invention, once crosslinked and formed the LCE or LCN, the LCP exhibits a mechanical response to a change in lighting, temperature, humidity, pH, or electromagnetic field. More preferably, the LCE or LCN exhibits mechanical response to light (both photo-chemically and photo-thermally). The incorporation of the photoactive functionality can mainly be approached by means of two different strategies. On one hand, a first strategy is based on the incorporation of photoisomerizable units such as azobenzene, spiropyran, diarylethenes, or rotaxanes which, when irradiated in their absorption bands, undergo isomerizations between their trans state, with an elongated shape and therefore favoring the CL order, and cis state, with a curved shape and disturbing the CL order. The generation of cis isomers by means of light disturbs the liquid crystal order and disrupts the mechanical properties of the system.

On the other hand, a second strategy is based on the incorporation of molecules or nano-objects with absorption. When irradiated in their absorption bands, they both very efficiently release heat, which is transferred to the material in which they are incorporated, the LCE in the present case, with mechanical actuation being produced in this way. It is also possible to use absorbent chromophores, capable of absorbing light of a certain wavelength and efficiently transforming light energy into heat, such as benzophenones, rhodamines, stilbenes, coumarins, or benzotriazole.

In another preferred embodiment of the valve of the invention, the substrate comprises PDMS or a cyclic olefin polymer structure.

In another preferred embodiment of the valve of the invention, the structural portion of the valve comprises:

one or more anti-adhesion openings arranged between said structural portion and the mechanically responsive material of the functional portion of the mentioned valve; and/or micro-roughness arranged between said structural portion and the material with mechanical response of the functional portion of the valve; and/or a mechanically inert material with a surface energy lower than 40 mJ/m$^2$; and/or an anti-adhesion coating.

A third object of the invention relates to a peristaltic pump comprising at least one valve according to any of the embodiments herein described, configured in combination with a passive flow restriction element; or configured as a successive arrangement of two or more valves according to any of the embodiments herein described.

A fourth object of the invention relates to a microfluidic system comprising a valve according to any of the embodiments herein described, in combination with an actuator of said valve, wherein said actuator comprises means adapted for regulating a physicochemical property to which the mechanically responsive material forming the functional portion of the mentioned valve is sensitive.

A fifth object of the invention relates to the use of a microfluidic valve, of a peristaltic pump, or of a system according to any of the embodiments herein described in in vitro biomedical analyses, drug screening analysis, in vitro biological studies, monitoring and control of environmental pollution, biological risk detection, food analysis, or in the manufacture of organ-on-a chip devices. Said organ-on-a chip devices provide a physiologically relevant biomimetic model which allows a better understanding of the specific functions and responses of tissues and organs and, therefore, the reaction to pharmacological treatments or the progression of certain pathologies, contributing in this way to the development of new tools for performing new physiological studies, drug development and screening, toxicology, and for personalized medicine.

In a preferred embodiment of the system of the invention, the means for regulating the physicochemical property comprise a lighting subsystem, a temperature regulation subsystem, a humidity regulation subsystem, a pH regulation subsystem, or an electromagnetic field regulation subsystem.

In the scope of the present invention, the expression "mechanically responsive" shall be interpreted as the property of a material whose molecular structure is disrupted over time in response to the external application of one or more physicochemical magnitudes, such as the lighting, the temperature, the humidity, the pH, or the electromagnetic field, among others. Likewise, in the scope of the invention, said property is reversible in the sense that if the applied physicochemical magnitude returns to a previous state or is applied under other conditions or in combination with other physicochemical magnitudes or stimuli, it is possible to return the molecular structure of the material to its original state. In the preferred embodiment of the invention referring to obtaining microfluidic valves, the mechanical response property shall be interpreted as the capability of modifying the structure of the functional portion of said valve to the extent that said valve can drive or regulate the flow of fluids in a microfluidic device or system.

In the scope of the present invention, the expression "mechanically inert over time" shall be interpreted as the substantial absence of mechanical reactivity over time in a material.

In the scope of the present invention, the expression "substantially" shall be interpreted as identical or comprised in a margin of ±10%.

In the scope of the present invention, the expression "structural portion of the valve" shall be interpreted as that portion which configures the shape and general structure of the valve, being formed by mechanically inert materials that do not undergo reversible substantial shape changes in the event of variations in one or more physicochemical parameters.

In the scope of the present invention, the expression "functional portion of the valve" shall be interpreted as that portion configuring the movable and actuation elements of the valve, being formed by mechanically responsive materials that undergo reversible substantial shape changes in the event of variations in one or more physicochemical parameters.

In the scope of the present invention, the expression "anti-adhesion treatment" shall be interpreted as that treatment that prevents the complete or partial irreversible adherence between:

the succession of filaments of the mechanically responsive material and the substrate of a mechanically inert material; and/or the succession of filaments of the mechanically responsive material and one or more of the additional layers of a mechanically inert material; and/or the substrate of a mechanically inert material and one or more of the additional layers of a mechanically inert material; and/or two or more of the additional layers of a mechanically inert material.

According to this interpretation, the following examples shall also be understood to be included:

the addition of a chemical agent with anti-adhesion capability to LCP;

the introduction of micro-roughness on the contact surface of the substrate of a mechanically inert material with the succession of filaments and/or one or more of the additional layers of a mechanically inert material;

the introduction of micro-roughness in one or more of the additional layers of a mechanically inert material;

the use of materials with a low surface energy for the manufacture of the substrate, the succession of filaments, and/or one or more of the additional layers of a mechanically inert material, with "material with a low surface energy" being understood as one with a surface energy lower than 40 mJ/m$^2$;

the application of an anti-adhesion coating on the substrate, on the succession of filaments, and/or on one or more of the additional layers of a mechanically inert material;

the spatial separation of the succession of filaments with respect to the substrate and/or one or more of the additional layers of a mechanically inert material, or any other arrangement thereof intended for limiting or preventing their adhesion to said substrate and/or one or more of the additional layers (for example, arranging the contact surfaces angled rather than parallel with respect to one another).

REFERENCE NUMBERS OF THE DRAWINGS (1) Substrate of a mechanically inert material.
(2) Filaments of a material with mechanical response.
(3) Fluid flow rate.
(4) Central printing region of the filaments of a mechanically reactive material.
(5) Additional layers of a mechanically inert material.
(6) Light.
(7) Anti-adhesion openings.

DETAILED DESCRIPTION OF THE INVENTION

As described in the preceding sections, as well as in the examples shown in FIGS. 1-7 of this document, the method for manufacturing microfluidic valves essentially comprises at least the following steps:

arranging a substrate (1) configuring a structural portion of the valve, wherein said substrate (1) comprises at least one mechanically inert material to one or more physicochemical properties over time.

printing a succession of one or more filaments (2) of a material with mechanical response to one or more of said physicochemical properties over time by additive layer manufacturing, wherein said material with mechanical response comprises at least one LCP, and wherein the printed filaments (2) configure a functional portion of the valve.

arranging the succession of filaments (2) of the mechanically responsive material on the substrate (1) of a mechanically inert material by applying an anti-adhesion treatment on one or more contact surfaces between said filaments (2) and the substrate (1).

Figure 1:
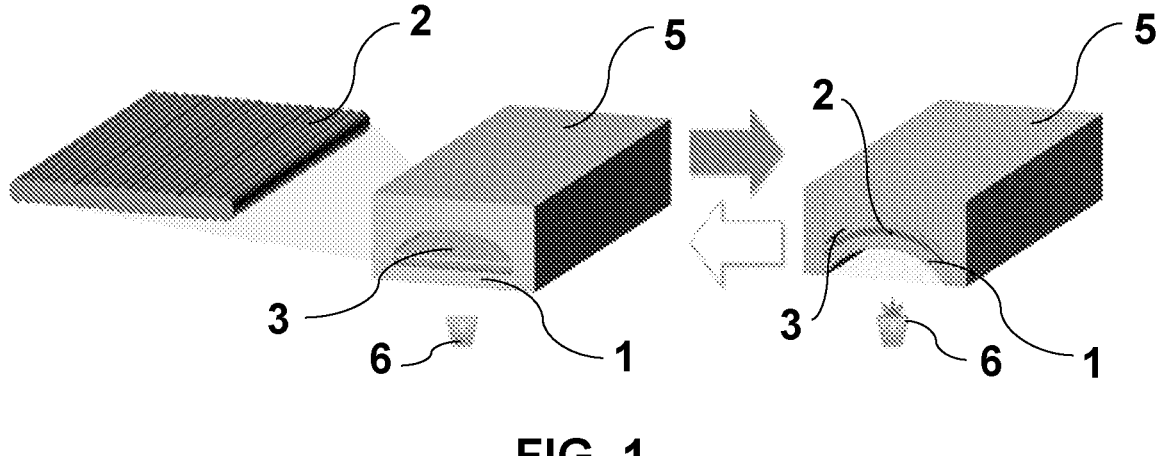
FIG. 1 shows an example of the microfluidic valve according to the present invention, in a preferred embodiment thereof.
Figure 2:
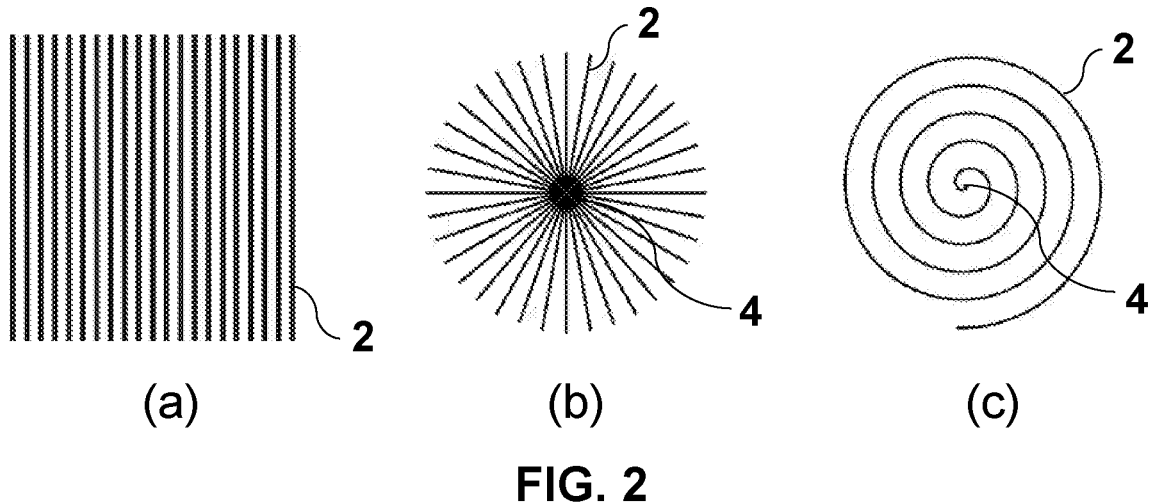
FIGS. 2a-2c show three examples of the two-dimensional printing pattern of a mechanically responsive material which can be used for the manufacture of a microfluidic valve of the invention, according to three preferred embodiments thereof.

As shown in FIG. 1, the substrate (1) and the succession of filaments (2) of the mechanically responsive material at least partially configure a fluid flow rate (3) through the valve. Likewise, the succession of filaments (2) of the mechanically responsive material is arranged, in the mentioned flow rate (3), such that the variation in one or more of the physicochemical parameters (for example, by means of lighting in a given frequency range) causes a disruption in the molecular order of the LCP, contracting or expanding the material along the longitudinal or transversal direction of the filaments (2), respectively, and leading to an increase or reduction of the fluid flow rate (3).

Figure 3:
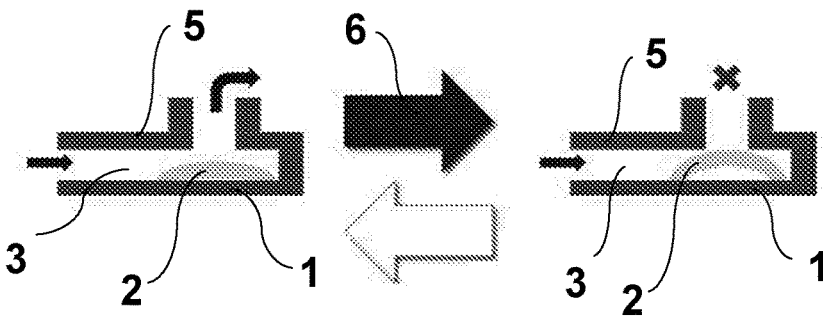
FIG. 3 shows an example of the general operating principle of the microfluidic valve of the invention, according to a preferred embodiment thereof.
Figure 4:
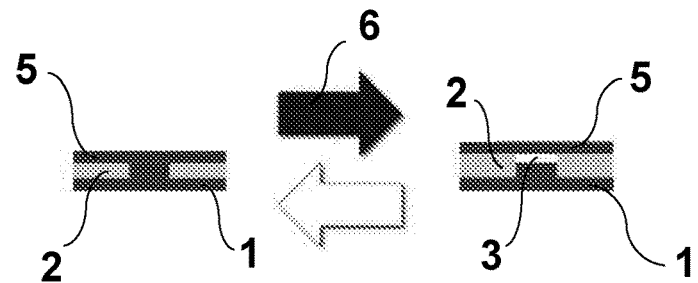
FIG. 4 shows an example of the microfluidic valve of the invention, according to a preferred embodiment thereof, implemented as a reverse-acting valve.

The configuration of the flow rate (3) shown in FIG. 1 therefore adopts a channel shape and can be configured with a curved channel geometry, which is adjusted to the actuator in the actuated state or can use a planar upper part acting on a channel, opening or closing it depending on the state of the valve (non-actuated or actuated), as shown in FIG. 3. This configuration is also advantageous, since the area of the functional portion in contact with the opposite wall of the structural portion is partial, which facilitates the subsequent detachment thereof when the mechanically responsive materials return to their initial state (non-actuated).

The stiffness of the mechanically responsive material used for printing the succession of filaments (2), as well as the ratio between the thickness and the dimensions in the plane (longitudinal and/or transversal) of the resulting LCE or LCN sheet, influence the degree of deformation of the functional portion of the valve. An excessive increase in these parameters reduces deformation, negatively impacting valve performance. Preferably, the succession of filaments (2) comprises LCPs which, when printed, give rise to an LCE-type cross-linked polymer system with a Young's modulus in the order of MPa or an LCN type cross-linked polymer system with a Young's modulus in the order of GPa. The longitudinal and/or transversal dimensions of the resulting LCE or LCN sheet are typically comprised between 1-20 mm and its thickness between 50-1500 μm.

Adhesion between the substrate (1) and the succession of filaments (2) also plays a key role in valve performance and can even cancel out its functionality if said adhesion is irreversible. Although it is true that the presence of liquids can reduce adhesion between certain surfaces, adhesion between surfaces in a liquid is also known to significantly increase with contact time. This latter scenario is what occurs when liquid is expelled from the contact area between the substrate (1) and the succession of filaments (2). For this reason, preventing or controlling this adhesion by means of the application of an anti-adhesion treatment is key. Preferably, said anti-adhesion treatment comprises:

the addition of a chemical agent with anti-adhesion capability to LCP, preferably one or more fluorinated modifiers or long-chain aliphatic silanes comprising, for example, nonyl trichlorosilane, octadecyl trichlorosilane, octyl trichlorosilane, fluoro-n-octyl trichlorosilane or fluoro-n-octyl trimethoxysilane; and/or the introduction of micro-roughness on the contact surface of the substrate (1) of a mechanically inert material with the succession of filaments (2) (e.g., by sandblasting using glass or metal as mechanically inert material), preferably with a mean square roughness, or mean square deviation of the profile in the order of a micron since, under these conditions, adhesion between elastomers and rigid surfaces is known to decrease considerably [Fuller et al. Proc. R. Soc. Lond. A 1975 345, 327-342]; and/or the use of materials with a surface energy lower than 40 mJ/m$^2$ for the manufacture of the substrate (1) and/or the succession of filaments (2), such as cyclic olefin polymers (COP, 30 mJ/m$^2$) and polydimethylsiloxane (PDMS, 19-21 mJ/m$^2$); and/or the application of an anti-adhesion coating on the substrate (1) of a mechanically inert material and/or on the succession of filaments (2), preferably comprising one or more fluoropolymers, such as polytetrafluoroethylene (PTFE); and/or the spatial separation of the succession of filaments (2) with respect to the substrate (1).

In this way, adhesion is drastically reduced by decreasing the probability of adhesion forces due to friction between the functional portion and the structural portion of the valve, which reduces the risk of failure thereof due to the possible fixing of one portion to the other. However, in those devices without these problems of adhesion between the substrate (1) and the succession of filaments (2), it would be possible not to apply said treatments.

For the suitable actuation of the valves of the invention, it is necessary to use mechanically responsive materials in the form of inks whose rheology leads, after the printing and, optionally, the curing thereof, to LCP filaments (2) with controlled morphology, according to the properties described above. To that end, said inks preferably comprise a mixture of main-chain LCPs with reactive acrylate groups at the end of the chain, together with a small amount of photoinitiator. Likewise, the mechanically responsive liquid crystal polymer preferably contains absorbent molecular units incorporated in its main chain, which are either photoresponsive (e.g., azobenzene, spiropyran, etc.), undergoing conformational changes upon absorbing light disturbing the liquid crystal order, or absorbent molecules which transform the absorbed light into heat, also disturbing the liquid crystal order. Another possibility is the incorporation of the units in the LCP ink as an additional monomer which later binds to the polymer structure. The polymer is primarily obtained by a Michael addition process, making a mixture of mesogenic diacrylates with reactive units, which are in turn mixed with n-butylamine in a molar ratio close to 1, with a diacrylate excess to ensure the formation of polymer chains, through the Michael addition reaction, with terminal acrylate groups which can subsequently react in a second step performed by photopolymerization. The amine-acrylate chemistry has been used as an example, but it is also possible to use other reactions for the formation of the reactive chains, such as the thiol-acrylate, amine-epoxy, etc., leading to the same effect. The inks thus prepared generally have viscoelastic behavior, where the easy formation of long and thin filaments (2) is possible by simply printing them from the polymer material, generating well oriented fibers, with the mesogenic monomers aligned in the printing direction. Other possibilities also include the use of photo-chemical or photo-thermal materials, such as inks containing nanoparticles or molecules which transform light into heat. The magneto-thermal effects can also be used in the scope of the invention, in different preferred embodiments thereof.

The substrate (1) of the valve preferably comprises one or more biocompatible materials, selected for example from those commonly used in microfluidic applications, such as PDMS or cyclic olefin polymer structures.

FIGS. 2a-2c show three examples of configurations adopted by the filaments (2) of the mechanically responsive material for the manufacture of different preferred embodiments of the valves of the invention. In that sense, FIG. 2a shows a succession of filaments (2) of the mechanically responsive material arranged as a plurality of substantially parallel lines, forming a rectangular or square surface. This configuration is what the valve of FIG. 1, for example, adopts. In another embodiment (FIG. 2b), the succession of filaments (2) of the mechanically responsive material is arranged adopting a substantially planar radial distribution, wherein each filament (2) starts from a central region (4) common to the rest of filaments (2). In an additional embodiment (FIG. 2c), the succession of filaments (2) of the mechanically responsive material is arranged, in the aforementioned fluid flow rate (3), as an azimuthal distribution and, as an approximation to same on a continuous path, a substantially planar spiral, starting from a central region (4) common to one or more of the filaments (2).

A potential problem with mechanically stressed composite actuators is the delamination of one or more of the materials used. To promote adhesion of the functional portion of the valve to the structural portion (at those points or regions where it is needed), specific chemicals can be applied to the latter. For example, exposing the corresponding surfaces to ozone generated by radiation ultraviolet (UV), oxygen plasma, or other gases, or treatments with hybrid organic-inorganic coupling agents for acrylate-based inks, such as 3-aminopropyltriethoxysilane, 3-aminopropyltrimethoxysilane, 3-aminopropyltrichlorosilane, 3-mercaptopropyltrimethoxysilane, 3-mercaptopropyltriethoxysilane, 3-methacryloxypropyltrimethoxysilane. This generates reactive species covalently bound to the surface, which can later be used as bonds for the acrylate inks when they are photocured, increasing the binding strength of said inks.

In other embodiments of the invention, the manufacturing method may also comprise the additional arrangement of one or more layers (5) of a mechanically inert material after printing the succession of filaments (2) with mechanical response, configuring one or more additional elements of the structural portion of the valve. Optionally, said method may comprise a step of applying an anti-adhesion treatment on one or more of the additional layers (5) of a mechanically inert material to prevent the irreversible adhesion between the layers (5), with the substrate (1), and/or with the succession of filaments (2).

In other embodiments of the invention, the manufacturing method may also comprise a step of applying a curing treatment, preferably after finishing printing the filaments (2) of the mechanically responsive material. Said curing step can be performed selectively on certain regions of the valve, wherein a succession of multiple curing operations can optionally be applied on said regions. The method of the invention also allows printing filaments (2) which deform (for example, due to an external mechanical action) before being cured. This possibility is interesting for certain complex valves or actuator designs. In other embodiments, the method of the invention also allows the printing of multistable structures of filaments (2), obtaining different deformations in each curing.

As an example of preferred embodiment of the invention, regarding to a light-sensitive valve (6), it is possible to use a PDMS substrate (1) on which the LCP filaments (2) are printed. The LCP-PDMS composite system can be manufactured by 3D printing the LCP material onto the PDMS, the latter being configured in the form of a film, chip, or a previously manufactured chip precursor part. Additional PDMS material can be added and cured to complete the process of manufacturing the chip. The 3D-printed LCP element can also be embedded within or on the underside of the PDMS. For example, the filaments of the mechanically light-responsive material (6) can be 3D printed, to create a membrane with its LCP director orientation parallel to the direction of the channel in the PDMS block, on top of the thin PDMS membrane base of the channel (as shown in FIG. 1). Considering the expansion induced by the light (6) in the direction perpendicular to the LCP director, the lighting on the active LCP element causes the expansion of the membrane along the direction perpendicular to the channel. If it is confined between two sufficiently thick fixed walls, the band bends, blocking the flow of fluid through the channel, therefore acting as a valve, according to the object of the invention.

In another preferred embodiment of the invention, the non-actuated valve closes the channel. Light actuation (6) opens the valve, allowing the liquid to flow as shown in the embodiment represented in FIG. 4, therefore configuring a reverse-acting valve design.

Figure 5A:
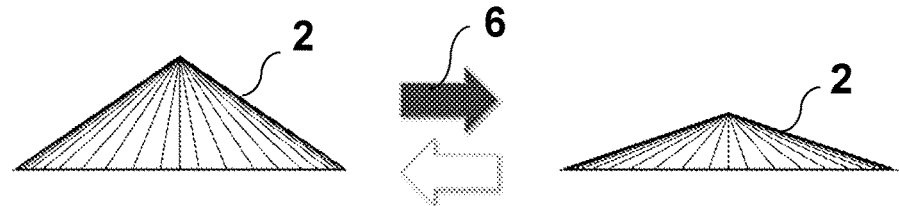
FIG. 5a shows an example of the three-dimensional printing pattern of a mechanically responsive material for the manufacture of a microfluidic valve of the invention.
Figure 5B:
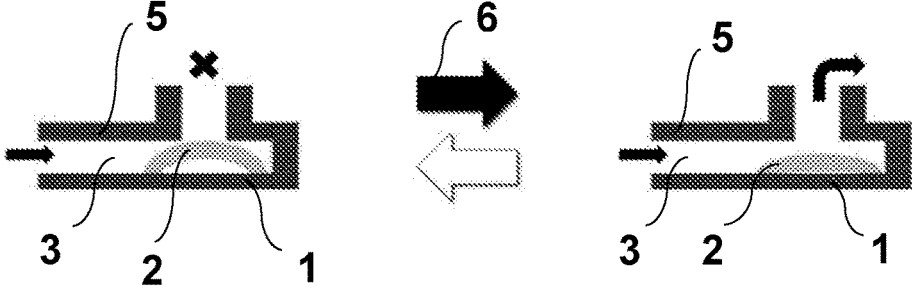
FIG. 5b shows a preferred embodiment thereof, implemented as a reverse-acting valve.

As an alternative to the printing of the succession of filaments (2) with essentially flat configurations (such as the ones shown in FIGS. 1-4), it is also possible to print said filaments (2) with a three-dimensional shape, preferably with a conical shape following a radial distribution such as the one shown in FIG. 5a. In this way, when the succession of filaments (2) is stimulated by an external agent (temperature, light, etc.), the shape of said succession of filaments (2) is modified into a cone of smaller height and wider base, allowing the realization of reverse-acting valves such as the one shown in FIG. 5b. In the absence of an external stimulus, this type of valve prevents the flow of the fluid, which is otherwise allowed.

Figure 6:
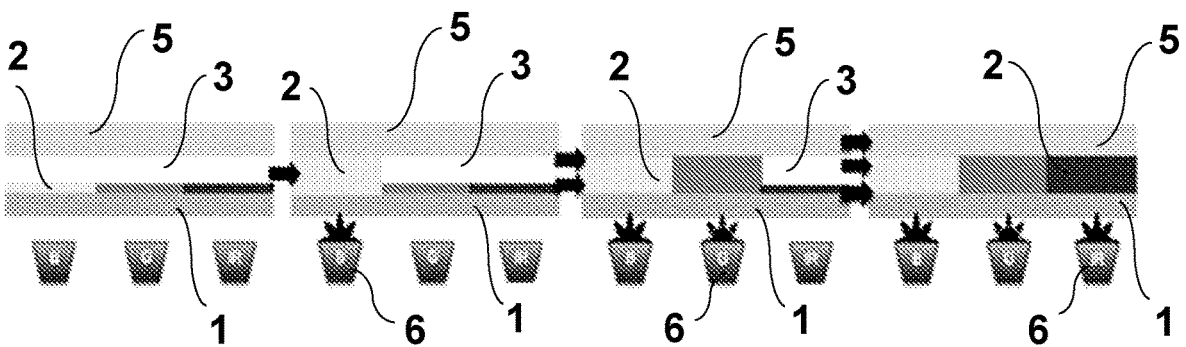
FIG. 6 shows a sequential arrangement of microfluidic valves according to the invention, configured as a peristaltic pump whose stages can be activated with light radiation of different wavelengths.

In other preferred embodiments of the invention, it is possible to manufacture more complex actuators with the proposed method. For example, it is possible to configure a succession of two or more valve-type elements, located individually, forming a peristaltic pump as shown in FIG. 6. In said embodiment, the mechanically responsive materials of the functional portion can be independently actuated with three light beams illuminating each of them separately. Alternatively, they can be manufactured with materials sensitive to different wavelengths (e.g., red (R), green (G), and infrared (IR) in said figure), and/or with each valve being actuated by different lights (6). An independent control of each valve is thereby provided, facilitating the realization of peristaltic movements in the flow rate (3) thereof, by means of a suitable sequence of lighting events. Irradiation with suitable intensities and sequences of light (6) thus causes a unidirectional flow of the fluid. In other embodiments of the invention, it is possible to configure the peristaltic pump as a combination of one or more valves according to any of the embodiments described herein and a passive flow restriction element.

Figure 7A:
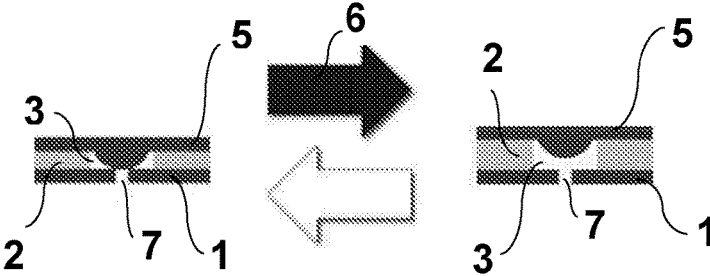
FIGS. 7a-7b show examples of a valve and of a peristaltic pump according to the invention, respectively, wherein the substrate thereof incorporates openings acting as anti-adhesion means.
Figure 7B:
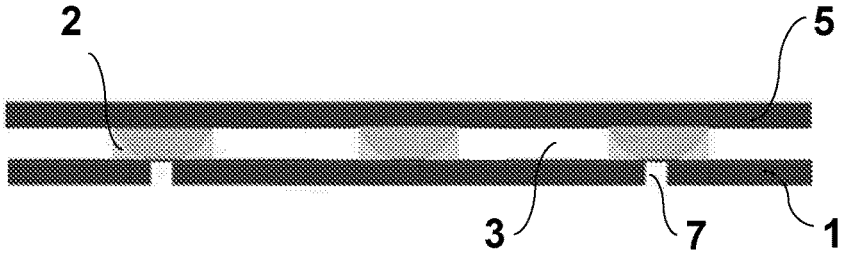

Other embodiments shown in FIGS. 7a-7b depict a valve design wherein the structural portion of said valve (and, preferably, its substrate (1)) comprises one or more openings (7) which act as anti-adhesion means, given that the use of geometries minimizing contact between parallel surfaces reduces adhesion therebetween.

Lastly, another object of the invention relates to a microfluidic system comprising a valve as herein described in combination with an actuator of said valve, wherein said actuator comprises means adapted for regulating a physico-chemical property to which the mechanically responsive material comprising the functional portion of the mentioned valve is sensitive. Examples of said actuators can be:

Light: Light can be applied by means of the use of light sources such as LEDs or lasers which can preferably form part of an external device controlling the microfluidic chip.

Temperature: The chip can incorporate resistive elements close to the LCE/LCN, so that when a current is applied, heat is dissipated, and the valve is actuated. In this case, the chip could have contact electrodes which are connected to an external control module. Alternatively, the chip can incorporate a light-absorbing sheet adjacent to the LCE which can transform light radiation into heat in the LCE and activate it.

Electrical: By incorporating additives both in the LCE/LCN and in an adjacent sheet which provide resistivity to the material, such as carbon nanotubes, carbon black, etc., it is possible to heat the LCE/LCN by applying current and thereby actuate the system.

Humidity or pH: Materials that incorporate, for example, hydrogen bonds are used both in the LCE/LCN and in an adjacent sheet for this purpose. The application of solutions with a suitable pH can weaken these bonds, changing the mechanical properties.

Magnetothermal: By incorporating additives both in the LCE/LCN and in an adjacent sheet that provide magneto-thermal properties to the material, such as iron nanopar-ticles, it is possible to heat the LCE/LCN by applying a magnetic field and thus actuate the system.

The invention claimed is:

1. A method for the manufacture of a microfluidic valve, wherein said method comprises performing the following steps:
   forming a structural portion of the valve by arranging a substrate, wherein said substrate comprises a mechanically inert material;
   forming a functional portion of the valve by printing a succession of filaments of a mechanically responsive material comprising a liquid crystal polymer (LCP);
   depositing the filaments on the substrate while applying an anti-adhesion treatment on one or more interfaces of said filaments and the substrate;
   wherein the substrate and the filaments together at least partially define a fluid flow channel of the valve, wherein the filaments are arranged within the fluid flow channel, such that variations in at least one physico-chemical parameter cause contraction or expansion of the mechanically responsive material along a longitu-dinal or transversal direction of the filaments, thereby modulating fluid flow rate through the channel.

2. The method according to claim 1, wherein the filaments are arranged in the fluid flow channel as a plurality of substantially parallel filaments, forming a rectangular or square surface.

3. The method according to claim 1, wherein the filaments are arranged in the fluid flow channel adopting a substantially planar radial distribution, wherein each filament starts from a central region common to all the filaments.

4. The method according to claim 1, wherein the filaments are arranged in the fluid flow channel as a substantially planar azimuthal or spiral distribution starting from a central region common to at least some of the filaments.

5. The method according to claim 1, further comprising adding a coupling agent between at least one part of the filaments and the substrate.

6. The method according to claim 5, wherein the coupling agent is a hybrid organic-inorganic coupling agent.

7. The method according to claim 1, wherein the anti-adhesion treatment comprises at least one of the group consisting of:
   adding a chemical agent with anti-adhesion capability to the filaments;
   introducing micro-roughness on a surface of the substrate onto which the filaments are to be deposited;
   selecting a material with a surface energy lower than 40 mJ/m$^2$ for the manufacture of the substrate or the filaments;
   applying an anti-adhesion coating on the substrate or on the filaments; and
   arranging the filaments on the substrate to provide spatial separation.

8. The method according to claim 7, wherein the chemical agent comprises one or more long-chain aliphatic or fluo-rinated modifiers.

9. The method according to claim 1, further comprising a step of arranging one or more layers of a mechanically inert material after printing the filaments, configuring one or more additional elements of the structural portion of the valve.

10. The method according to claim 9, further comprising a step of applying an anti-adhesion treatment to the one or more layers of the mechanically inert material in the arrang-ing step.

11. The method according to claim 1, comprising a step of applying a curing treatment after finishing the printing of the filaments.

12. The method according to claim 11, wherein the curing treatment is performed selectively in certain regions of the valve, or wherein the curing treatment comprises applying a succession of multiple curing operations on said regions.

13. The method according to claim 1, wherein the fila-ments are successively printed so as to form a three-dimensional shape.

14. The method according to claim 13, wherein the filaments are successively printed so as to form a conical shape.

15. A valve for regulating a flow of a fluid through a microfluidic device, wherein the valve is manufactured by the method according to claim 1.

16. The valve according to claim 15, wherein the mechanically responsive material comprises a main-chain LCP with reactive acrylate end groups and one or more photoinitiators.

17. The valve according to claim 15, wherein the LCP exhibits a mechanical response when exposed to a change in light, temperature, humidity, pH or electromagnetic field.

18. The valve according to claim 15, wherein the LCP is capable of responding to light photothermally or photo-chemically.

19. The valve according to claim 18, wherein the LCP comprises azobenzene, spiropyran, diarylethene, rotaxane, absorbent nanoparticles, or absorbent chromophores.

20. The valve according to claim 15, wherein the substrate comprises PDMS or a cyclic olefin polymer structure.

21. The valve according to claim 15, wherein the structural portion of the valve comprises:

one or more anti-adhesion openings arranged between the structural portion and the mechanically responsive material of the filaments; and/or micro-roughness arranged between the structural portion and the mechanically responsive material of the filaments; and/or a mechanically inert material with a surface energy lower than 40 mJ/m$^2$; and/or an anti-adhesion coating.

22. A peristaltic pump comprising a successive arrangement of two or more valves according to claim 15 or one or more valves according to claim 15 in combination with a passive flow restriction element.

23. A microfluidic system comprising:

a valve according to claim 15; and an actuator of said valve adapted for regulating the at least one physicochemical parameter to which the mechanically responsive material configuring the functional portion of the valve is sensitive.

24. The system according to claim 23, wherein the actuator comprises a lighting subsystem, a temperature regulation subsystem, a humidity regulation subsystem, a pH regulation subsystem, or an electromagnetic field regulation subsystem.

25. A microfluidic valve comprising: the valve according to claim 15 configured for in vitro biomedical analyses, the manufacture of organ-on-a chip devices, drug screening analysis, in vitro biological studies, the monitoring and control of environmental pollution, biological risk detection, or food analysis.

\* \* \* \* \*